(12) United States Patent
Sekiya et al.

(10) Patent No.: US 9,979,064 B2
(45) Date of Patent: May 22, 2018

(54) TUNABLE DUAL-BAND BAND-PASS FILTER

(71) Applicants: UNIVERSITY OF YAMANASHI, Kofu-shi, Yamanashi (JP); THE JAPAN STEEL WORKS, LTD., Shinagawa-ku, Tokyo (JP)

(72) Inventors: Naoto Sekiya, Kofu (JP); Katsuhiro Terao, Tokyo (JP); Kazuhito Kishida, Tokyo (JP); Yasuo Sato, Yokohama (JP); Noritaka Kitada, Yokohama (JP)

(73) Assignees: UNIVERSITY OF YAMANASHI, Kofu-shi, Yamanashi (JP); THE JAPAN STEEL WORKS, LTD., Shinagawa-ku, Tokyo (JP)

( * ) Notice: Subject to any disclaimer, the term of this patent is extended or adjusted under 35 U.S.C. 154(b) by 241 days.

(21) Appl. No.: 14/808,183

(22) Filed: Jul. 24, 2015

(65) Prior Publication Data

US 2016/0164485 A1 Jun. 9, 2016
US 2017/0033758 A9 Feb. 2, 2017

(30) Foreign Application Priority Data

Dec. 9, 2014 (JP) ................................. 2014-248878
Jun. 3, 2015 (JP) ................................. 2015-113512

(51) Int. Cl.
*H01P 1/203* (2006.01)
*H01P 7/08* (2006.01)
(Continued)

(52) U.S. Cl.
CPC ...... *H01P 1/20309* (2013.01); *H01P 1/20372* (2013.01); *H01P 7/082* (2013.01);
(Continued)

(58) Field of Classification Search
CPC .... H01P 1/20; H01P 7/08; H01P 7/088; H01P 7/015; H01P 1/203; H01P 1/20309;
(Continued)

(56) References Cited

U.S. PATENT DOCUMENTS

2010/0188171 A1* 7/2010 Mohajer-Iravani ... H01P 1/2005
333/175

FOREIGN PATENT DOCUMENTS

| JP | 2002-057506 A | 2/2002 |
| JP | 3535469 B | 3/2004 |
| JP | 2015-142297 A | 8/2015 |

OTHER PUBLICATIONS

*Dual-Band Filter based on Non-Degenerate Dual-Mode Slow-Wave Open-Loop Resonators*, by J. Hong et al, IEEE, MTT-S International Microwave Symposium Digest, 2009, pp. 861-864.

* cited by examiner

*Primary Examiner* — Rakesh Patel
(74) *Attorney, Agent, or Firm* — Flynn, Thiel, Boutell & Tanis, P.C.

(57) ABSTRACT

A tunable dual-band resonator and a tunable dual-band band-pass filter using the tunable dual-band resonator. The dual-band resonator is structured such that a stub is added to each half-wavelength resonator provided with half-wavelength resonator protrusions (capacity-component adjust parts). The dual-band resonator is made up of an odd-number mode resonator in a shape including a ground conductor disposed on the back surface of a dielectric body, and a strip conductor disposed on the top surface thereof, and an even-number mode resonator in such a shape as to be formed when the stub is connected to an end face on the opposite side of the open-end of the strip, characterized in that a dielectric rod having a circular cross section is provided in the space above the respective stubs and another
(Continued)

dielectric rod having a circular cross section is provided in the space above the half-wavelength resonator protrusions.

1 Claim, 12 Drawing Sheets

(51) Int. Cl.
    *H01P 7/10*         (2006.01)
    *H03H 7/01*         (2006.01)
    *H03H 9/24*         (2006.01)

(52) U.S. Cl.
    CPC .............. *H01P 7/088* (2013.01); *H01P 7/105* (2013.01); *H03H 7/0161* (2013.01); *H03H 9/24* (2013.01); *H03H 2210/028* (2013.01)

(58) Field of Classification Search
    CPC .. H01P 1/20318; H01P 7/105; H01P 1/20372; H01P 7/082; H03H 7/0161
    USPC ................................ 333/204, 205, 219, 238
    See application file for complete search history.

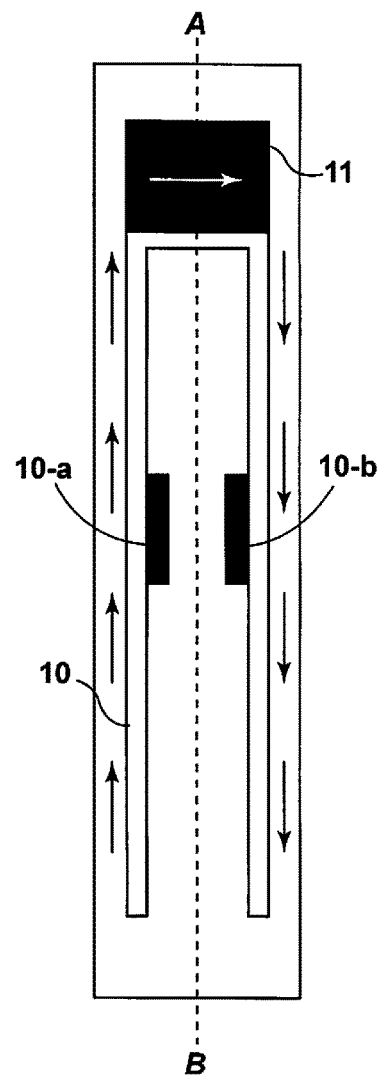
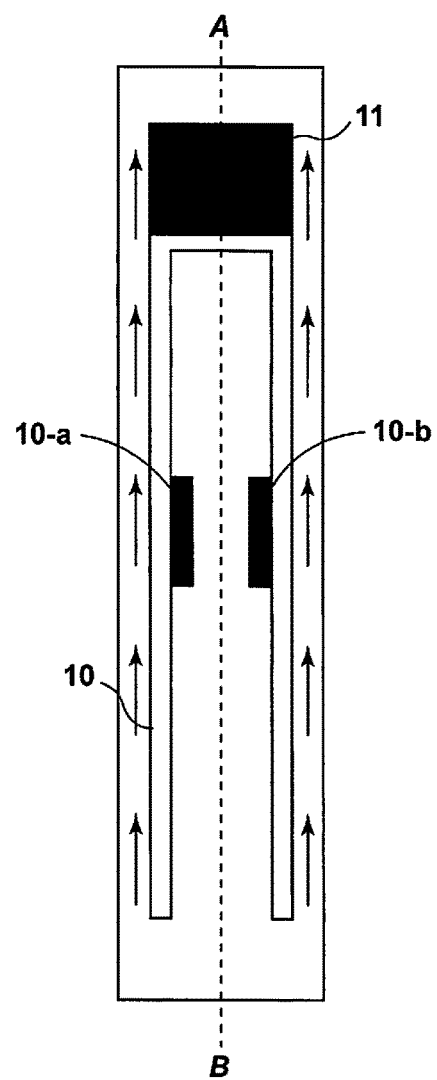
FIG. 5(a)   FIG. 5(b)

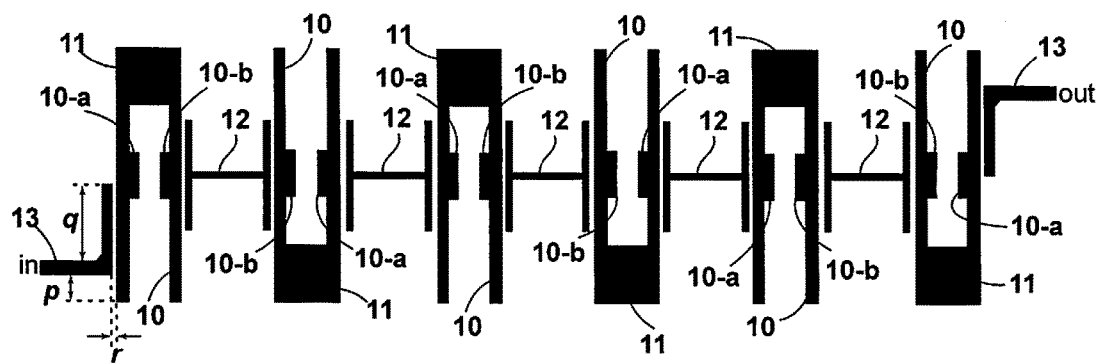
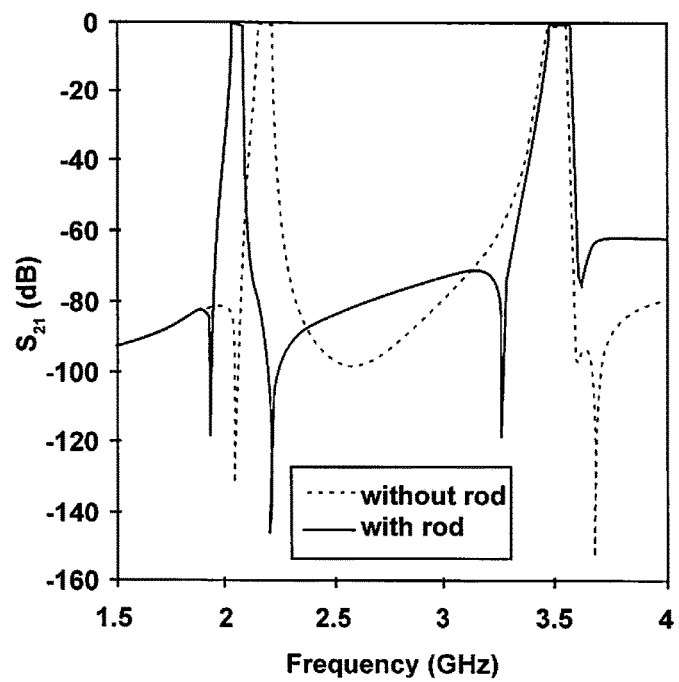
FIG. 10

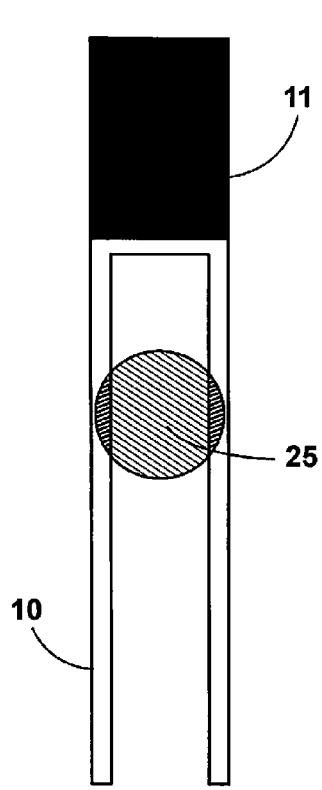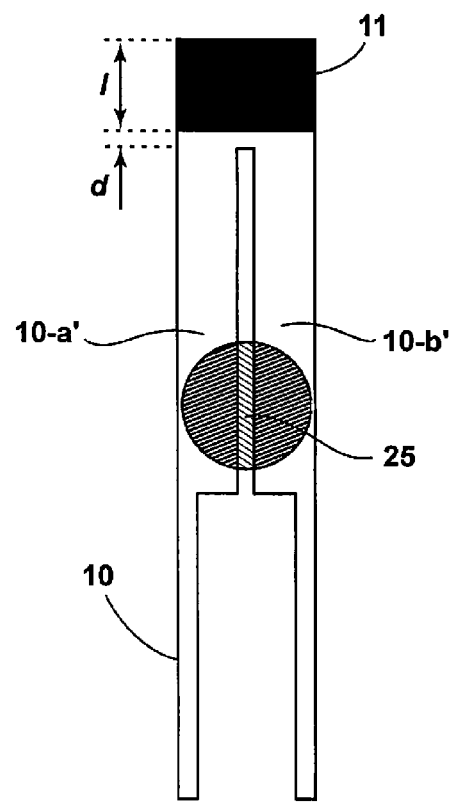
FIG. 11(a)
(PRIOR ART)
FIG. 11(b)

TUNABLE DUAL-BAND BAND-PASS FILTER

The invention relates to frequency-tuning as well as improvement (trimming) of the band-pass characteristics of equipment using a high-frequency wave and a microwave, that is, a tunable dual-band band-pass filter utilized for transmitting/receiving of a signal, in the field of communication technology, including, for example, mobile communication, satellite communication, fixed microwave communication, etc.

BACKGROUND OF THE INVENTION

Data communications for video, and so forth have recently undergone a tremendous explosion in use, so that network-capacity crunch and frequency-resources crunch are anticipated on a worldwide basis, posing a major problem. In order to cope with this situation, development of a microwave filter for use by a base station of mobile communications is asked for so as to concurrently implement the effective utilization of high-speed/large-capacity communication and frequency-resources. Further, communication equipment capable of coping with a plurality of frequency-bands is also lately desired.

A method of communication by the concurrent use of two frequency-bands has been proposed as one of the methods for implementing high-speed/large-capacity communication. There has been proposed a dual-band band-pass filter which allows two frequency-bands to concurrently pass therethrough, representing the elemental technology of the method described as above.

There exists the traditional method of making up a dual-band band-pass filter having two pass-bands, as described hereunder. As shown in FIG. 1, a plurality of a dual-band resonators N1, N2, and N3, resonating at two frequencies, are subserviently coupled with each other, to be coupled with input/output ports M1, M2, provided at the respective ends of subservient coupling, thereby making up a filter 100 (Non-patent Document 1).

The dual-band resonators N1, N2, N3 each has even-number/odd-number modes, and the dual-band band-pass filter having the two pass-bands is made up by controlling these two modes. With this filter 100, there is the need for directly coupling the input/output ports M1, M2 to the dual-band resonators N1, and N3, at the respective ends of the filter 100, thereby deciding a connection position for enabling desired characteristics to be concurrently obtained in both the two pass-bands.

Meanwhile, a band-pass filter having an abrupt cut-off characteristic is required for effective utilization of frequency-resources. In general, an abrupt cut-off characteristic can be realized by adoption of a multistage operation to thereby increase the number of resonators. However, since a normal conductor, such as copper, etc., has a resistance, an insertion loss will increase along with the multistage operation, so that it has been impossible to realize a trade-off between a low-loss and the abrupt cut-off characteristic. There has been proposed, for example, a superconducting band-pass filter, as one of the methods for solving this problem (Patent document 1). As a superconductor has a surface resistance lower by 2 to 3 orders of magnitude as compared with copper, etc., in a microwave-band, so that the insertion loss can be suppressed to be low even after a multistage operation, thereby enabling the trade-off between the low-loss and the abrupt cut-off characteristic to be realized.

Further, there has been proposed a center-frequency tunable dual-band band-pass filter capable of varying the center-frequency of the band-pass filter, as a method coping with a plurality of frequency-bands.

FIG. 2 of Patent document 2 is a view showing the configuration of a traditional superconducting tunable dual-band band-pass filter by way of example. A dielectric plate S10 is disposed above a microstrip-type filter pattern S1 formed on a dielectric substrate S5. A distance h between the dielectric plate S10 and the filter pattern S1 is varied by use of an actuator such as a piezoelectric element, etc. and so forth, to cause an electric-field distribution radiated from the filter pattern S1 to be varied, thereby rendering the center-frequency variable (Patent document 2).

A dual-band band-pass filter is realized by use of a dual-band resonator capable of realizing a resonance frequency in two pass-bands by use of one resonator. A center-frequency, in the respective bands of the dual-band band-pass filter shown in FIG. 1, is dependent on the even-number/odd-number modes occurring to the respective dual-band resonators N1, N2, and N3. Because the respective odd-number mode portions of the dual-band resonators N1, N2, N3 are for use in common with the even-number modes, adjustment of the odd-number modes affects the even-number modes. A bandwidth of each band is controlled by a distance between the resonators with respect to the respective dual-band resonators N1, N2, N3, however, if the tuning of the center-frequency is applied to this dual-band band-pass filter by use of the dielectric plate S10, this will cause the whole surface above the dual-band band-pass filter to be covered with the dielectric plate. Accordingly, both modes of the even-number/odd-number modes of the dual-band band-pass filter will be affected, so that the tuning of the center-frequency is possible, however, it is difficult to tune the center-frequency independently of the even-number/odd-number modes. Further, since the filter in whole is covered with the dielectric plate, an electromagnetic field distribution between the dual-band resonators, as well, will be affected, thereby causing a problem in that the bandwidth as well undergoes variation. Furthermore, an increase in the shift amount of the center-frequency will result in degeneration of the band-pass characteristics, so that a trimming mechanism for adjustment of the resonance frequency of each of the resonators will be required aside from a frequency tuning mechanism. Herein, by "trimming" is meant a method of improvement of the band-pass characteristics.

The inventors have proposed a center-frequency tunable dual-band band-pass filter, as a method of solving these problems, as shown in Patent Document 3. The center-frequency tunable dual-band band-pass filter is capable of tuning (varying) two pass-bands independently of respective center-frequencies, and improving the band-pass characteristics that will degenerate after the tuning of the respective center-frequencies by use of the frequency tuning mechanism without newly introducing the trimming mechanism.

Further, in FIG. 3, mention is made of a dielectric rod 25 that has an ellipse-like cross section and is highly efficient in varying a shift amount of resonance in the odd-number mode, thereby proposing that the shift amount of the resonance in the odd-number mode can be changed by installing the dielectric rod 25, in a space above a half-wavelength resonator 10. However, upon fine-tuning of the space between the half-wavelength resonator 10 and the dielectric rod 25, if the cross section of the dielectric rod 25 is ellipse-like in shape, a tip portion of the long diameter of the ellipse will exceed the width of the strip conductor of the half-wavelength resonator 10 when rotated, thereby causing a characteristic in value to be extremely changed, so that there is the need for causing the dielectric rod 25 to approach the half-wavelength resonator 10, or to distance itself from the half-wavelength resonator 10. Accordingly, upon the fine-tuning of the space between the half-wavelength resonator 10 and the dielectric rod 25, a special device is required of the dielectric rod 25 having an ellipse-like cross section.

In the case of a dual-band band-pass filter using a superconductor, in particular, a measurement is conducted in a vacuum chamber, while cooling to −200° C. or lower by use of a refrigerator, and there is therefore the need for raising or lowering the dielectric rod 25 by vertically moving it from outside the chamber. For this reason, it is particularly desirous for the dielectric rod 25 to be structured so as to be pushed in by turning a screw. In such a case, if the rod 25 is formed in the shape of an ellipse in order to increase the shift amount of the resonance in the odd-number mode, there will arise the need for a mechanism capable of raising and lowering the rod 25 without rotating the same, whereupon the tuning mechanism will be considerably complicated to thereby cause an increase in size. In this case, there is a possibility that the tuning mechanism itself cannot be installed above the filter, thereby posing a problem in that use of the rod 25 in the shape of the ellipse is not practical from the viewpoint of cost.

PRIOR ART DOCUMENTS

Patent Document 1: JP2002-57506A
Patent Document 2: JP 3535469B2
Patent Document 3: JP2014-014962
Non-Patent Document: Jia-Sheng Hong, Wenxing Tang, "Dual-band filter based on non-degenerate dual-mode slow-wave open-loop resonators", IEEE MTT-S International Microwave Symposium Digest, pp. 861-864, 2009.

SUMMARY OF THE INVENTION

The present invention proposed is a dual-band band-pass filter efficient in varying the shift amount of resonance in an odd-number mode without requiring a special device.

A representative dual-band resonator for use in the present invention is of a basic structure in which a stub 11 is added to a half-wavelength resonator 10 provided with half-wavelength resonator protrusions (capacity-component adjust parts) 10-a, 10-b as shown in FIG. 4.

As to the shape of each of the half-wavelength resonator protrusions (capacity-component adjust parts) 10-a, 10-b, it need only be sufficient for the half-wavelength resonator protrusion to protrude along a strip conductor, and it may be rectangular or staircase-like in shape, however, preferably laterally symmetric in shape. The half-wavelength resonator protrusions (capacity-component adjust parts) 10-a, 10-b are basically conductors capable of conducting electricity excellently like the strip conductor.

As shown in FIG. 4, with the dual-band resonator structured such that the stub 11 is added to each half-wavelength resonator 10, symmetric A-B planes of the stubs 11 function as an electrical/magnetic wall, respectively. The dual-band resonator operates in two frequency-bands due to the resonance in an odd-number mode and resonance in an even-number mode, and can adjust a resonator length such that the half-wavelength resonator 10 serves as the resonator in the odd-number mode and the half-wavelength resonator 10 and the stub serve 11 as the resonator in the even-number mode, thereby causing the odd-number mode to resonate on a low-frequency side, while causing the even-number mode to resonate on a high-frequency side, alternatively enabling the odd-number mode to resonate on the high-frequency side, while enabling the even-number mode to resonate on the low-frequency side.

The dual-band resonator is made up of an odd-number mode resonator including a ground conductor in a predetermined thickness disposed on the back surface of a dielectric body, and a strip conductor disposed on the top surface thereof, wherein the relevant strip conductor is one length of a thin strip conductor cut off at an open-end thereof (the location where the strip is not linked), provided with a deeply retreated groove having a width g, one length of the strip conductor is in a laterally symmetric shape, having a width d, and provided at the tip of the groove as well as the end face of the strip conductor, and an even-number mode resonator in such a shape that the stub 11 having a length 1 is connected to an end face on the opposite side of the open-end of the strip. The dual-band resonator operates as the odd-number mode resonator, when the electric current flows to the symmetric A-B planes of the stubs 11, while operating as the even-number mode resonator when the electric current does not flow to the symmetric A-B planes, as shown in FIG. 5. The inventors of the present invention found a structure enabling the dual-band resonator to be tunable, which was as disclosed in Patent Document 3. With the tunable dual-band resonator according to the present invention, the frequency characteristics in the odd-number mode was further improved.

That is, the present invention provides a tunable dual-band resonator structured such that a stub is added to each half-wavelength resonator 10, and each thereof is provided with half-wavelength resonator protrusions (capacity-component adjust parts) 10-a, 10-b, and symmetric A-B planes of the stubs 11, functioning as an electrical/magnetic wall, respectively.

The dual-band resonator operates in two frequency-bands due to the resonance in an odd-number mode and resonance in an even-number mode (resonance), and can adjust a resonator length such that the half-wavelength resonator 10 serves as the resonator in the odd-number mode, while the half-wavelength resonator 10 and the stub 11 serve as the resonator in the even-number mode, thereby causing the odd-number mode to resonate on a low-frequency side, while causing the even-number mode to resonate on a high-frequency side, alternatively, enabling the odd-number mode to resonate on the high-frequency side, while enabling the even-number mode to resonate on the low-frequency side.

The dual-band resonator is made up of an odd-number mode resonator in the shape including a ground conductor in a predetermined thickness disposed on the back surface of a dielectric body, and a strip conductor disposed on the top surface of the dielectric body, the relevant strip conductor is one length of a thin strip conductor cut off at an open-end thereof (the location where the strip is not linked), provided with a deeply retreated groove having a width g, and one length of the strip conductor is in a laterally symmetric shape, having a width d, and provided at the tip of the groove as well as the end face of the strip conductor, and an even-number mode resonator in such a shape as to be formed when the stub 11 having a length 1 is connected to an end face on the opposite side of the open-end of the strip, wherein the dual-band resonator operates as the odd-number mode resonator, when the electric current flows to the symmetric A-B planes of the stubs 11, while operating as the even-number mode resonator when the electric current does not flow to the symmetric A-B planes, characterized in that a dielectric rod 25 having a circular cross section is provided in the space above the respective stubs 11, a dielectric rod 25 having a circular cross section is provided in the space above the half-wavelength resonator protrusions (capacity-component adjust parts) 10-a, 10-b of the half-wavelength resonator 10, enabling a resonance frequency in the even-number mode, and a resonance frequency in the odd-number mode to be tuned independently from each other.

Still further, the present invention provides a tunable dual-band band-pass filter having a structure incorporating a dual-band structured such that a stub is added to each half-wavelength resonator 10, each thereof being provided with half-wavelength resonator protrusions (capacity-component adjust parts) 10-a, 10-b, and symmetric A-B planes of the stubs 11 functioning as an electrical/magnetic wall, respectively.

The dual-band resonator operates in two frequency-bands due to the resonance in an odd-number mode and resonance in an even-number mode, and can adjust a resonator length such that the half-wavelength resonator 10 serves as the resonator in the odd-number mode, while the half-wavelength resonator 10 and the stub 11 serve as the resonator in the even-number mode, thereby causing the odd-number mode to resonate on a low-frequency side, while causing the even-number mode to resonate on a high-frequency side, alternatively, enabling the odd-number mode to resonate on the high-frequency side, while enabling the even-number mode to resonate on the low-frequency side.

The dual-band resonator is made up of an odd-number mode resonator in a shape including a ground conductor in a predetermined thickness disposed on the back surface of a dielectric body, and a strip conductor disposed on the top surface of the dielectric body, the relevant strip conductor is one length of a thin strip conductor cut off at the open-end thereof (the location where the strip is not linked), and provided with a deeply retreated groove having a width g, and one length of the strip conductor is in a laterally symmetric shape, having a width d, and provided at the tip of the groove as well as the end face of the strip conductor, and including the half-wavelength resonator protrusions (capacity-component adjust parts) 10-a, 10-b, and an even-number mode resonator in such a shape as to be formed when the stub 11 having a length 1 is connected to an end face on the opposite side of the open-end of the strip, wherein the dual band resonator operates as the odd-number mode resonator when the electric current flows to the symmetric A-B planes of the stubs 11, while operating as the even-number mode resonator when the electric current does not flow to the symmetric A-B planes, characterized in that a dielectric rod 25 having a circular cross section is provided in the space above the half-wavelength resonator protrusions (capacity-component adjust parts) 10-a, 10-b of the half-wavelength resonator 10 and a dielectric rod 25 having a circular cross section is provided in the space above the respective stubs 11.

Further, the present invention provides a multistage-type (two-stage) dual-band band-pass filter having a structure incorporating three units (in total) of dual-band resonators (first and second resonators), and each dual-band resonator is structured such that a stub 11 is added to each half-wavelength resonator 10, and each thereof is provided with half-wavelength resonator protrusions (capacity-component adjust parts) 10-a, 10-b, and symmetric A-B planes of the stubs 11 function as an electrical/magnetic wall, respectively.

The dual-band resonator operates in two frequency-bands due to resonance in an odd-number mode and resonance in an even-number mode, and can adjust a resonator length such that the half-wavelength resonator 10 serves as the resonator in the odd-number mode, whereas the half-wavelength resonator 10 and the stub 11 serve as the resonator in the even-number mode, thereby causing the odd-number mode to resonate on a low-frequency side, while causing the even-number mode to resonate on a high-frequency side, alternatively, enabling the odd-number mode to resonate on the high-frequency side, while enabling the even-number mode to resonate on the low-frequency side.

The first dual-band resonator is made up of an odd-number mode resonator in a shape including a ground conductor in a predetermined thickness disposed on the back surface of a dielectric body, and a strip conductor disposed on the top surface of the dielectric body, the relevant strip conductor is one length of a thin strip conductor cut off at the open-end thereof (the location where the strip is not linked), and provided with a deeply retreated groove having a width g, and one length of the strip conductor is in a laterally symmetric shape, having a width d, and provided at the tip of the groove as well as the end face of the strip conductor, and also including the half-wavelength resonator protrusions (capacity-component adjust parts) 10-a, 10-b, and an even-number mode resonator in such a shape as to be formed when the stub 11 having a length 1 is connected to an end face on the opposite side of the open-end of the strip, wherein the dual band resonator operates as the odd-number mode resonator when the electric current flows to the symmetric A-B planes of the stubs 11, while operating as the even-number mode resonator when the electric current does not flow to the symmetric A-B planes. The second dual-band resonator is identical in configuration to the first dual-band resonator, and the orientation thereof is varied by 180 degrees, provided with an H-shaped waveguide 12, an end face thereof having a length n, and located at a given interval m away from the first dual-band resonator, wherein feeder conductor lines 13 are provided along half-wavelength resonator 10 of the first dual-band resonator as well as the second dual-band resonator, and wherein the feeder conductor line 13 on one side, functions as an input side, while the feeder conductor line 13 on the other side, functions as an output side, characterized in that a dielectric rod 25 having a circular cross section is provided in the space above each of the half-wavelength resonator protrusions (capacity-component adjust parts) 10-a, 10-b of the half-wavelength resonator 10, and a dielectric rod 25 having a circular cross section is provided in the space above each of the respective stubs 11.

Furthermore, with the two-stage dual-band band-pass filter according to the present invention, there is provided a method of adjusting the shift amount of frequency-tuning so as to adjust the band-pass characteristics in the odd-number mode alone by adjusting the distance of only the respective dielectric rods 25 having a circular cross section, provided in the space above the half-wavelength resonator protrusions (capacity-component adjust parts) 10-a, 10-b of the half-wavelength resonator 10, from the tunable dual-band band-pass filter, entirely at the same height.

Still further, with the two-stage dual-band band-pass filter according to the present invention, there is provided a method of adjusting to shift amount of frequency-tuning so as to adjust the band-pass characteristics in the even-number mode alone by adjusting the distances of only the respective rods 25 having a circular cross section, provided in the space above the respective stubs 11, from the tunable dual-band band-pass filter, entirely at the same height.

Still furthermore, with reference to the adjustment method according to the present invention, in the method of improving (trimming) the degeneration in the band-pass characteristics, occurring after the tuning of the respective center-frequencies in the two-stage tunable dual-band band-pass filter, the band-pass characteristics in the odd number mode alone can be improved by individually adjusting the distance of only the respective dielectric rod 25 having a circular cross section, provided in the space above the half-wavelength resonator protrusions (capacity-component adjust parts) 10-*a*, 10-*b* of the half-wavelength resonator 10, from the tunable dual-band band-pass filter.

Yet further, with reference to the adjustment method according to the present invention, in the method of improving (trimming) the degeneration in the band-pass characteristics, occurring after the tuning of the respective center-frequencies in the two-stage tunable dual-band band-pass filter, the band-pass characteristics in the even-number mode alone can be improved by individually adjusting the distance of only the respective dielectric rod 25 having a circular cross section, provided in the space above the respective stubs 11, from the tunable dual-band band-pass filter.

Further, the present invention provides a multistage-type (three-stage) dual-band band-pass filter having a structure incorporating three-units (in total) of dual-band resonators (first, second and third resonators), and each dual-band resonator is structured such that a stub 11 is added to each half-wavelength resonator 10, and provided with half-wavelength resonator protrusions (capacity-component adjust parts) 10-*a*, 10-*b*, and symmetric A-B planes of the stubs 11 function as an electrical/magnetic wall, respectively.

The dual-band resonator operates in two frequency-bands due to the resonance in an odd-number mode and resonance in an even-number mode, and can adjust the resonator length such that the half-wavelength resonator 10 serves as the resonator in the odd-number mode, whereas the half-wavelength resonator 10 and the stub 11 serve as the resonator in the even-number mode, thereby causing the odd-number mode to resonate on a low-frequency side, while causing the even-number mode to resonate on a high-frequency side, alternatively, enabling the odd-number mode to resonate on the high-frequency side, while enabling the even-number mode to resonate on the low-frequency side.

The first dual-band resonator is made up of an odd-number mode resonance-waveguide in a shape including a ground conductor in a predetermined thickness disposed on the back surface of a dielectric body, and a strip conductor disposed on the top surface of the dielectric body, and the relevant strip conductor is one length of a thin strip conductor cut off at the open-end thereof (the location where the strip is not linked), and provided with a deeply retreated groove having a width g, and one length of the strip conductor is in a laterally symmetric shape, having a width d, and provided at the tip of the groove as well as the end face of the strip conductor, and also including the half-wavelength resonator protrusions (capacity-component adjust parts) 10-*a*, 10-*b*, and an even-number mode resonance-waveguide in such a shape as to be formed when the stub 11 having a length 1 is connected to an end face on the opposite side of the open-end of the strip, wherein the first dual band resonator operates as the odd-number mode resonance-waveguide, when the electric current flows to the symmetric A-B planes of the stubs 11, while operating as the even-number mode resonance-waveguide when the electric current does not flow to the symmetric A-B planes. The second dual-band resonator is identical in configuration to the first dual-band resonator, and the orientation thereof is varied by 180 degrees, and provided with an H-shaped waveguide 12, an end face thereof having a length n, and located at a given interval m away from the first dual-band resonator, and incorporates the half-wavelength resonator protrusions (capacity-component adjust parts) 10-*a*, 10-*b*. The third dual-band resonator is identical in configuration to the first dual-band resonator, and the orientation thereof is varied by 180 degrees, and provided with an H-shaped waveguide 12, an end face thereof having a length n, and located at a given interval m away from the second dual-band resonator. The second dual-band resonator is provided between the first dual-band resonator and the third dual-band resonator, wherein feeder conductor lines 13 are provided along the half-wavelength resonator 10 of the first dual-band resonator as well as the third dual-band resonator, the feeder conductor line 13 on one side functions as an input side, while the feeder conductor line 13 on the other side functions as an output side. Whereupon the multistage-type dual-band band-pass filter serves as the three-stage dual-band band-pass filter, characterized in that a dielectric rod 25 having a circular cross section is provided in the space above each of the half-wavelength resonator protrusions (capacity-component adjust parts) 10-*a*, 10-*b* of the half-wavelength resonator 10, and the dielectric rod 25 having a circular cross section is provided in the space above each of the respective stubs 11.

Furthermore, with the three-stage dual-band band-pass filter according to the present invention, there is provided a method of adjusting the shift amount of frequency-tuning so as to adjust the band-pass characteristics in the odd-number mode alone by adjusting the distance of only the respective dielectric rods 25 having a circular cross section, provided in the space above the half-wavelength resonator protrusions (capacity-component adjust parts) 10-*a*, 10-*b* of the half-wavelength resonator 10, from the tunable dual-band band-pass filter.

Still further, with the three-stage dual-band band-pass filter according to the present invention, there is provided a method of adjusting the shift amount of frequency-tuning so as to adjust the band-pass characteristics in the even-number mode alone by adjusting the distances of only the respective rods 25 having a circular cross section, provided in the space above the respective stubs 11, from the tunable dual-band band-pass filter.

Still furthermore, with reference to the adjustment method according to the present invention, in the method of improving (trimming) the degeneration in the band-pass characteristics, occurring after the tuning of the respective center-frequencies in the three-stage tunable dual-band band-pass filter, the band-pass characteristics in the odd-number mode alone can be improved by individually adjusting the distance of only the respective dielectric rod 25 having a circular cross section, provided in the space above the half-wavelength resonator protrusions (capacity-component adjust parts) 10-*a*, 10-*b* of the half-wavelength resonator 10, from the tunable dual-band band-pass filter.

Yet further, with reference to the adjustment method according to the present invention, in the method of improving (trimming) the degeneration in the band-pass characteristics, occurring after the tuning of the respective center-frequencies in the three-stage tunable dual-band band-pass filter, the band-pass characteristics in the even-number mode alone can be improved by individually adjusting the distance of only the respective dielectric rod 25 having a circular cross section, provided in the space above the respective stubs 11, from the tunable dual-band band-pass filter.

Further, the present invention provides a multistage-type (n-stage) dual-band band-pass filter having a structure incorporating n-units (in total) of dual-band resonators (first, second, third, fourth, . . . nth resonators), and each dual-band resonator is structured such that a stub 11 is added to each half-wavelength resonators 10, and provided with half-wavelength resonator protrusions (capacity-component adjust parts) 10-a, 10-b, and symmetric A-B planes of the stubs 11 function as an electrical/magnetic wall, respectively.

The dual-band resonator operates in two frequency-bands due to the resonance in an odd-number mode and resonance in an even-number mode, and can adjust the resonator length such that the half-wavelength resonator 10 serves as the resonator in the odd-number mode, whereas the half-wavelength resonator 10 and the stub 11 serve as the resonator in the even-number mode, thereby causing the odd-number mode to resonate on a low-frequency side, while causing the even-number mode to resonate on a high-frequency side, alternatively, enabling the odd-number mode to resonate on the high-frequency side, while enabling the even-number mode to resonate on the low-frequency side.

The first dual-band resonator is made up of an odd-number mode resonance-waveguide in a shape including a ground conductor in a predetermined thickness disposed on the back surface of a dielectric body, and a strip conductor disposed on the top surface of the dielectric body, and the relevant strip conductor is one length of a thin strip conductor cut off at the open-end thereof (the location where the strip is not linked), and provided with a deeply retreated groove having a width g, and one length of the strip conductor is in a laterally symmetric shape, having a width d, and provided at the tip of the groove as well as the end face of the strip conductor, and also including the half-wavelength resonator protrusions (capacity-component adjust parts) 10-a, 10-b, and an even-number mode resonance-waveguide in such a shape as to be formed when the stub 11 having a length 1 is connected to an end face on the opposite side of the open-end of the strip, wherein the first dual band resonator operates as the odd-number mode resonance-waveguide, when the electric current flows to the symmetric A-B planes of the stubs 11, while operating as the even-number mode resonance-waveguide when the electric current does not flow to the symmetric A-B planes. The second dual-band resonator is identical in configuration to the first dual-band resonator, and the orientation thereof is varied by 180 degrees, and provided with an H-shaped waveguide 12, an end face thereof having a length n, and located at a given interval m away from the first dual-band resonator, and incorporates the half-wavelength resonator protrusions (capacity-component adjust parts) 10-a, 10-b. The third dual-band resonator is identical in configuration to the first dual-band resonator, and the orientation thereof is varied by 180 degrees, and provided with an H-shaped waveguide 12, an end face thereof having a length n, and located at a given interval m away from the second dual-band resonator. The second dual-band resonator is provided between the first dual-band resonator and the third dual-band resonator, wherein feeder conductor lines 13 are provided along the half-wavelength resonator 10 of the first dual-band resonator as well as the third dual-band resonator. The feeder conductor line 13 on one side functions as an input side, while the feeder conductor line 13 on the other side functions as an output side. The multistage-type dual-band band-pass filter further includes the fourth, the fifth, the . . . nth dual-band resonators, and serves as the n-stage dual-band band-pass filter, characterized in that a dielectric rod 25 having a circular cross section is provided in the space above each of the half-wavelength resonator protrusions (capacity-component adjust parts) 10-a, 10-b of the half-wavelength resonator 10, and the dielectric rod 25 having a circular cross section is provided in the space above each of the respective stubs 11.

Further, the present invention provides a tunable dual-band resonator structured such that each stub 11 is added to each half-wavelength resonator 10, and stepped impedance structures 10-a', 10-b' which are structured or formed by extending half-wavelength resonator protrusions (capacity-component adjust parts) 10-a, 10-b close to a connection portion between each stub 11 and each half-wavelength resonator 10, and symmetric A-B planes of the stubs 11 function as an electrical/magnetic wall, respectively.

The dual-band resonator operates in two frequency-bands due to the resonance in an odd-number mode and resonance in an even-number mode, and can adjust the resonator length such that the half-wavelength resonator 10 serves as the resonator in the odd-number mode, whereas the half-wavelength resonator 10 and the stub 11 serve as the resonator in the even-number mode, thereby causing the odd-number mode to resonate on a low-frequency side, while causing the even-number mode to resonate on a high-frequency side, alternatively, enabling the odd-number mode to resonate on the high-frequency side, while enabling the even-number mode to resonate on the low-frequency side.

The dual-band resonator is made up of an odd-number mode resonator in the shape including a ground conductor in a predetermined thickness disposed on the back surface of a dielectric body, and a strip conductor disposed on the top surface of the dielectric body, the relevant strip conductor is one length of a thin strip conductor cut off at an open-end thereof (the location where the strip is not linked), provided with a deeply retreated groove having a width g, and one length of the strip conductor is in a laterally symmetric shape, having a width d, and provided at the tip of the groove as well as the end face of the strip conductor, and an even-number mode resonator in such a shape as to be formed when the stub 11 having a length 1 is connected to an end face on the opposite side of the open-end of the strip, wherein the dual-band resonator operates as the odd-number mode resonator, when the electric current flows to the symmetric A-B planes of the stubs 11, while operates as the even-number mode resonator when the electric current does not flow to the symmetric A-B planes, characterized in that a dielectric rod 25 having a circular cross section is provided in the space above the respective stubs 11, and another dielectric rod 25 having a circular cross section is provided in the space above the stepped impedance structures 10-a', 10-b' of the half-wavelength resonator 10, wherein each rod 25 is vertically moved in given positions to implement tuning, thereby enabling a resonance frequency in the odd-number mode and a resonance frequency in the even-number mode to be tuned independently from each other.

Further, the present invention provides a tunable dual-band band-pass filter having a structure incorporating a dual band resonator structured such that each stub 11 is added to each half-wavelength resonator 10, and stepped impedance structures 10-a', 10-b' which are structured or formed by extending half-wavelength resonator protrusions (capacity-component adjust parts) 10-a, 10-b close to a connection point between each stub 11 and each half-wavelength resonator 10, and symmetric A-B planes of the stubs 11 function as an electrical/magnetic wall, respectively.

The dual-band resonator operates in two frequency-bands due to the resonance in an odd-number mode and resonance in an even-number mode, and can adjust the resonator length such that the half-wavelength resonator 10 serves as the resonator in the odd-number mode, whereas the half-wavelength resonator 10 and the stub 11 serve as the resonator in the even-number mode, thereby causing the odd-number mode to resonate on a low-frequency side, while causing the even-number mode to resonate on a high-frequency side, alternatively, enabling the odd-number mode to resonate on the high-frequency side, while enabling the even-number mode to resonate on the low-frequency side.

The dual-band resonator is made up of an odd-number mode resonator in the shape including a ground conductor in a predetermined thickness disposed on the back surface of a dielectric body, and a strip conductor disposed on the top surface of the dielectric body, the relevant strip conductor is one length of a thin strip conductor cut off at an open-end thereof (the location where the strip is not linked), provided with a deeply retreated groove having a width g, and one length of the strip conductor is in a laterally symmetric shape, having a width d, and provided at the tip of the groove as well as the end face of the strip conductor, and an even-number mode resonator in such a shape as to be formed when the stub 11 having a length 1 is connected to an end face on the opposite side of the open-end of the strip, wherein the dual-band resonator operates as the odd-number mode resonator, when the electric current flows to the symmetric A-B planes of the stubs 11, while operating as the even-number mode resonator when the electric current does not flow to the symmetric A-B planes, characterized in that a dielectric rod 25 having a circular cross section is provided in the space above the respective stubs 11, and another dielectric rod 25 having a circular cross section is provided in the space above the stepped impedance structures 10-*a*', 10-*b*' of the half-wavelength resonator 10, wherein each rod 25 is vertically moved in given positions to implement tuning, thereby enabling the resonance frequency in the odd-number mode and the resonance frequency in the even-number mode to be tuned independently from each other.

Still further, the present invention provides a tunable dual-band resonator, according to the tunable dual-band resonator set forth above, wherein protrusions (capacity-component adjust parts) 10-*a*'*l*, 10-*b*'*l* are provided by expanding a part of the stepped impedance structures 10-*a*', 10-*b*' in an outward direction of the groove, respectively.

More still further, the present invention provides a tunable dual-band band-pass filter employing the tunable dual-band resonator set forth above.

Further, the present invention provides a multistage-type (n-stage) dual-band band-pass filter having a structure incorporating the dual-band resonator set forth above, and each dual-band resonator having a structure incorporating n-units (in total) of dual-band resonators (first, second, third, fourth, . . . nth resonators). The first dual-band resonator has protrusions (capacity-component adjust parts) 10-*a*'*l*, 10-*b*'*l* which are provided by expanding a part of the stepped impedance structures 10-*a*', 10-*b*' in an outward direction of the groove. The second dual-band resonator is identical in configuration to the first dual-band resonator, and the orientation thereof is varied by 180 degrees, and provided with an H-shaped waveguide 12, an end face thereof having a length n, and located at a given interval m away from the first dual-band resonator. The third dual-band resonator is identical in configuration to the first dual-band resonator, and the orientation thereof is varied by 180 degrees, and provided with an H-shaped waveguide 12, an end face thereof having a length n, and located at a given interval m away from the second dual-band resonator. The second dual-band resonator is provided between the first dual-band resonator and the third dual-band resonator, wherein feeder conductor lines 13 are provided along half-wavelength resonator 10 of the first dual-band resonator as well as the third dual-band resonator. The feeder conductor line 13 on one side functions as an input side, while the feeder conductor line 13 on the other side functions as an output side. The multistage-type dual-band band-pass filter further includes the fourth, the fifth, the . . . nth dual-band resonators, and serves as the n-stage dual-band band-pass filter, characterized in that a dielectric rod 25 having a circular cross section is provided in the space above each of the protrusions (capacity-component adjust parts) 10-*a*'*l*, 10-*b*'*l* that are provided by expanding a part of the stepped impedance structures 10-*a*', 10-*b*' in an outward direction of the groove, and another dielectric rod 25 having a circular cross section is provided in the space above each of the respective stubs 11.

Advantageous Effects of Invention

The present invention has a high design-flexibility with respect to the center-frequency, the band-width, and input/output matching, in each of the two pass-bands. Further, with the present invention, the respective center-frequencies of the two pass-bands can be tuned independently from each other, and furthermore, the band-pass characteristics, undergoing degeneration after the tuning, can be improved. The present invention can provide both a tunable dual-band resonator, in which the shift width of the resonance in the odd-number mode can be considerably increased, and a tunable dual-band band-pass filter using the tunable dual-band resonator.

BRIEF DESCRIPTION OF DRAWINGS

FIG. 5(*a*) is a view showing electric-current distribution in the dual-band resonator adopted in the present invention in case of odd-number mode, FIG. 5(*b*) is a view showing electric-current distribution in the dual-band resonator in case of even-number mode;

FIG. 10 is a view showing a six-stage tunable dual-band band-pass filter adopting the half-wavelength resonator provided with the half-wavelength resonator protrusions (capacity-component adjust parts) 10-*a*, 10-*b* (upper part in figure), and the frequency characteristics thereof (lower part in figure);

FIG. 11(*a*) is a view showing a common dual band resonator, and FIG. 11(*b*) is a view showing a dual band resonator wherein a half-wavelength resonator is structured in a stepped impedance structure;

BEST MODE FOR CARRYING OUT THE INVENTION

For the dielectric substrate for use in the present invention, use can be made of a commonly-known dielectric body, and a dielectric body having an excellent formability is preferably used. A material having a small dielectric dissipation factor is preferable in order to control the dielectric loss. Further, a material having a high heat conductivity is preferable in order to control the rise in temperature. Further, with reference to a normal conductor as well as a superconductor, for use in the strip conductor and a microstrip-line, respectively, use can be of any known material. Still further, with reference to the constituent material of each of the half-wavelength resonator protrusions (capacity-component adjust parts) 10-*a*, 10-*b*, and the normal conductor as well as the superconductor, for use in the strip conductor and the microstrip-line, respectively, as well, use can be of any known material.

Figure 4:
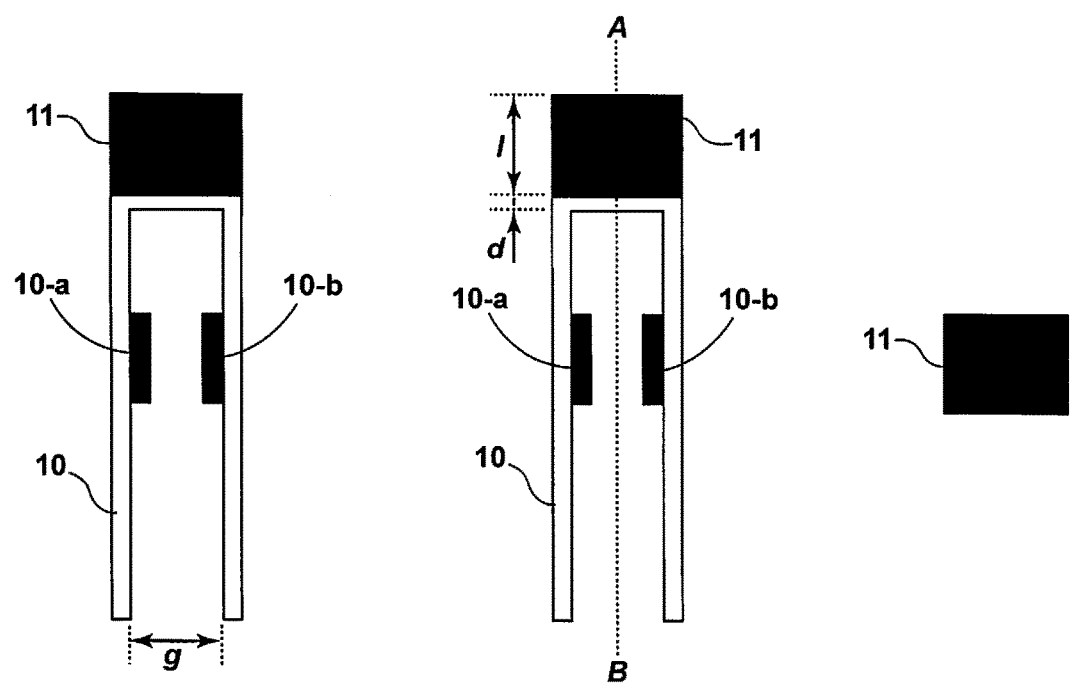
FIG. 4 is a plan view showing a dual band resonator used in the present invention.

In FIG. 4, there is shown a structure of the resonator for use in the present invention, as a representative constituent-unit. FIG. 4 is a view showing the half-wavelength resonator (resonance in the odd-number mode) 10 provided with the half-wavelength resonator protrusions (capacity-component adjust parts) 10-*a*, 10-*b*, the half-wavelength resonator 10 being basically in the shape of a laterally symmetric microstrip-line structure resembling hairpins, each thereof being provided with the groove having a width g.

In FIG. 4, the stub 11 is shown at the right-side end. For a constituent material of the stub 11, as well, use can be made of any known material for use in the normal conductor as well as the superconductor, used in the strip conductor and the microstrip-line, respectively. As to the shape of each of the half-wavelength resonator protrusions (capacity-component adjust parts) 10-*a*, 10-*b*, it need only be sufficient for the half-wavelength resonator protrusion to protrude along the strip conductor, and the half-wavelength resonator protrusion may be rectangular or staircase-like in shape, however, it is preferably laterally symmetric in shape.

At the center of FIG. 4, with the dual-band resonator structured such that the stub 11 is added to each half-wavelength resonator 10 in the shape of a hairpin, symmetric A-B planes of the stubs 11 function as an electrical/magnetic wall, respectively. The dual-band resonator operates in two frequency-bands due to the resonance in an odd-number mode and resonance in an even-number mode, and it can adjust a resonator length such that the half-wavelength resonator 10 serves as the resonator in the odd-number mode, whereas the half-wavelength resonator 10 and the stub serve 11 as the resonator in the even-number mode, thereby causing the odd-number mode to resonate on a low-frequency side, while causing the even-number mode to resonate on a high-frequency side, alternatively enabling the odd-number mode to resonate on the high-frequency side, while enabling the even-number mode to resonate on the low-frequency side. The dual-band resonator is made up of an odd-number mode resonator including a ground conductor in a predetermined thickness disposed on the back surface of a dielectric body, and a strip conductor disposed on the top surface thereof, wherein the relevant strip conductor is one length of a thin strip conductor cut off at an open-end thereof (the location where the strip is not linked), and provided with a deeply retreated groove having a width g, and the one length of the strip conductor is in a laterally symmetric shape, and has a width d, that is provided at the tip of the groove as well as the end face of the strip conductor. The dual-band resonator is also made up of an even-number mode resonator in such a shape that the stub 11 having a length 1 is connected to an end face on the opposite side of the open-end of the strip, wherein the dual-band resonator is characterized in operating as the odd-number mode resonator, when the electric current flows to the symmetric A-B planes of the stubs 11, while operating as the even-number mode resonator when the electric current does not flow to the symmetric A-B planes, as shown in FIG. 5.

The dual-band resonator can make up a dual-band band-pass filter singly or by combination of plural units.

The respective constituent materials of the strip conductor 10 (half-wavelength resonator), and the dielectric rod 25 which is movable in a direction vertical to the stub 11 are each preferably a material having a high dielectric constant and low dielectric dissipation factor, the material including sapphire, Kyosera V380, and so forth. The dielectric rod 25 according to the present invention is preferably in a bar-like shape having a circular cross section to be structured so as to be pushed in by turning a screw. Further, the diameter of a circle in cross section is preferably in a range of the width g of the groove up to the outer width across the two lengths of the strip conductor 10 (half-wavelength resonator), at the maximum.

Since the tunable dual-band resonator and the tunable dual-band ban-pass filter using the tunable dual-band resonator according to the present invention are basically the same as those disclosed in Patent Document 3 (JP 2014-014962) because the present invention is different from Patent Document 3 only in the point of use of the half-wavelength resonator provided with the half-wavelength resonator protrusions (capacity-component adjust parts) 10-*a*, 10-*b* instead of the half-wavelength resonator, which was proposed by the inventors of the present invention, and hence the basic structures of the tunable dual-band resonator and the tunable dual-band ban-pass filter using the tunable dual-band resonator according to the present invention are the same as those of the tunable dual-band resonator and the tunable dual-band ban-pass filter using the tunable dual-band resonator, which were disclosed in Patent Document 3 and proposed by the inventors of the present invention. Accordingly, with the tunable dual-band ban-pass filter according to the present invention, it is possible to implement the adjustment method of the shift amount of frequency-tuning for adjusting the band-pass characteristics in the odd-number mode alone, the adjustment method of the shift amount of frequency-tuning for adjusting the band-pass characteristics in the even-number mode alone, and the method of improving or trimming the degeneration in the band-pass characteristics, occurring after the tuning of the frequencies, in the same way as disclosed in Patent Document 3.

Although a structure of the present invention is described next, it is possible for those skilled in the art to imitate and manufacture a dual-band ban-pass filter resembling the structure of the present invention, and hence the present invention is not limited only to the structure as described hereunder.

Example 1

For an embodiment of the resonator according to the present invention, use is made of a microstrip-line structure, however, it is to be pointed out that the present invention is not limited thereto.

Figure 1:
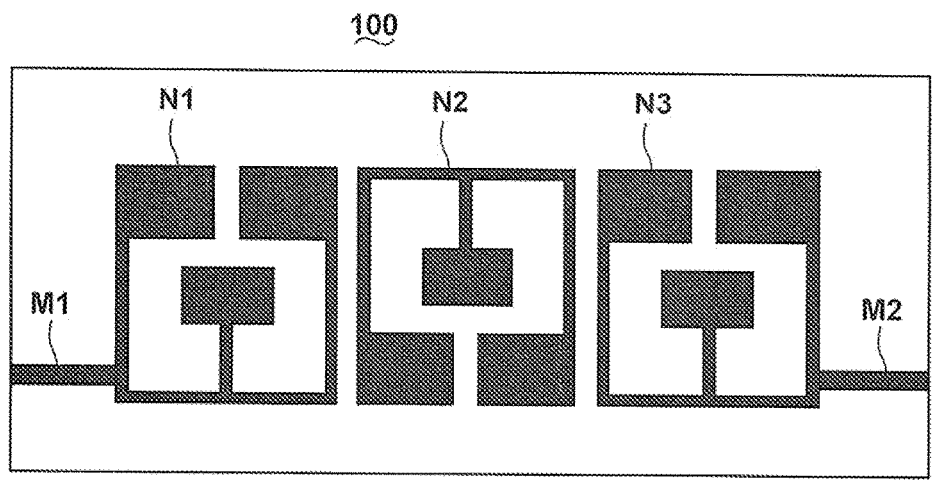
FIG. 1 is a view showing a conventional dual band resonator.
Figure 2:
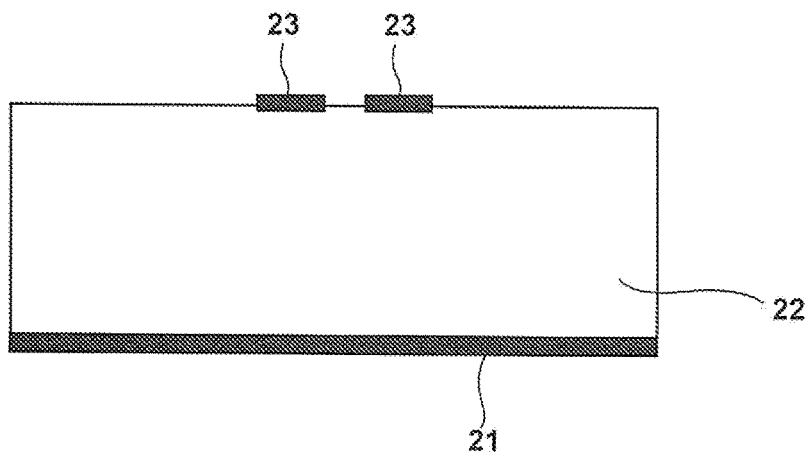
FIG. 2 is a side view showing a dual band resonator according to the present invention.
Figure 3:
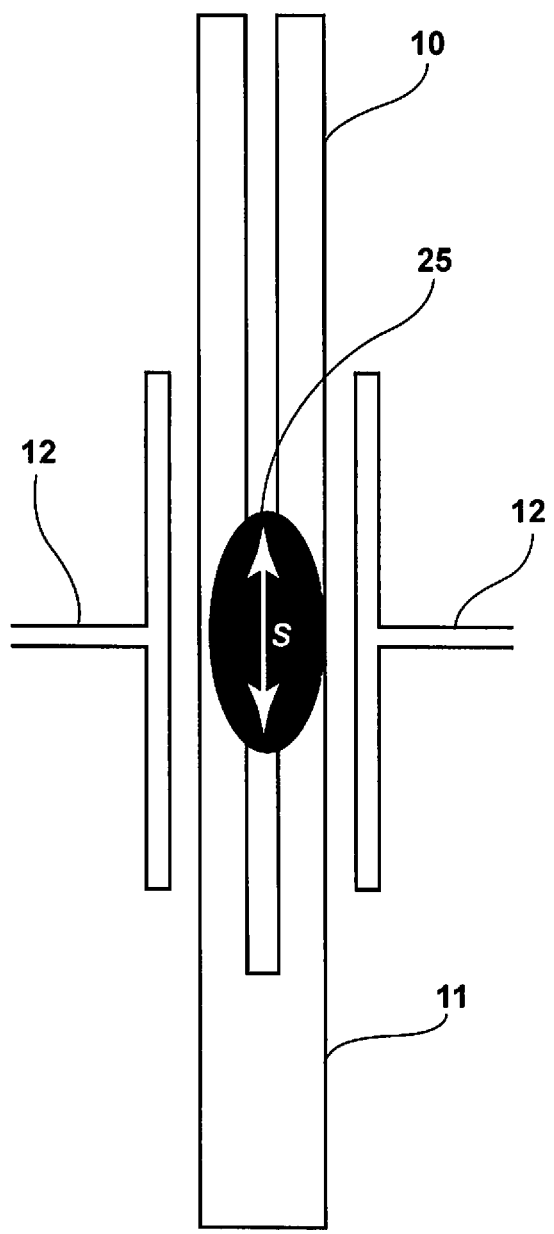
FIG. 3 is a view showing a dielectric rod 25 that has an ellipse-like cross section and is highly efficient in varying a shift amount of resonance in an odd-number mode proposed by the inventors of the present invention (reference example)

With the present invention, the microstrip-line structure was adopted, and the external appearance of the resonator as a whole is as shown in FIG. 2. More specifically, a strip conductor 23 (equivalent to a half-wavelength resonator 10, a stub 11, a waveguide 12, and a feeder conductor line 13, etc.) is provided on the top of a dielectric body 22 and a ground conductor 21 is provided underneath the dielectric body 22. The dielectric body 22 is preferably formed by use of a material having a small dielectric dissipation factor in order to control the dielectric loss. Further, the dielectric body 22 is preferably formed by the use of a material having a high heat conductivity in order to control the rise in temperature. The ground conductor 21 is preferably formed by the use of a material having a small conductor loss, a superconducting material, in particular. The strip conductor as well is preferably formed by the use of a material having a small conductor loss, a superconducting material, in particular (the foregoing can be said of all figures showing the resonator as well as the filter, using the microstrip-line structure). A switch can be provided as necessary between the half-wavelength resonator 10 and the stud 11, in FIG. 4, however, the present embodiment shows one without the switch being provided.

In the dual-band resonator of FIG. 4, the A-B plane functions as the electrical/magnetic wall, and the dual-band resonator serves as the dual-band band-pass filter operating in the two frequency-bands due to the resonance in the odd-number mode and resonance in the even-number mode. The dual-band resonator is of a basic structure in which the stub 11 is added to the half-wavelength resonators 10. Further, the dual-band resonator serves as the resonator in the odd-number mode, whereas the half-wavelength resonator, together with the stub, serves as the resonator in the even-number mode.

FIG. 5 is a view showing the electric-current distribution in the dual-band resonator according to the present invention. In the case of the odd-number mode, an electric-current flowing through the dual-band resonator will flow through only the half-wavelength resonator 10, whereupon the half-wavelength resonator 10 operates as an odd-number mode resonator as shown in FIG. 5(*a*). A bend part of the half-wavelength resonator 10 is the central part thereof at this point in time, having a voltage at 0 and the electric-current at the maximum, so that the bend part can be regarded as GND, the stub 11 therefore exerting no influence on the resonance frequency of the half-wavelength resonator 10. In the case of the even-number mode, the electric-current flows through both the half-wavelength resonator 10 and the stub 11, whereupon the half-wavelength resonator 10 operates as a half-wavelength straight-line resonator as shown in FIG. 5(*b*).

As is evident from the electric-current distribution set forth above, the half-wavelength resonator 10 can function as the odd-number mode resonator when the current flows through the symmetric A-B planes, while the half-wavelength resonator 10 can function as the even-number mode resonator when the current does not flow through the symmetric A-B planes, so that the half-wavelength resonator 10 functions as the dual-band resonator.

According to the resonator of the present invention, the resonator length was adjusted so that the odd-number mode resonates on a low-frequency side, while the even-number mode resonates on a high-frequency side. In some cases, the resonator length can be adjusted so that the odd-number mode resonates on the high-frequency side, while the even-number mode resonates on the low-frequency side. It is desired to downsize the dual-band resonator by assembling the half-wavelength resonator 10 and stub 11 into a stepped impedance structure.

Figure 6:
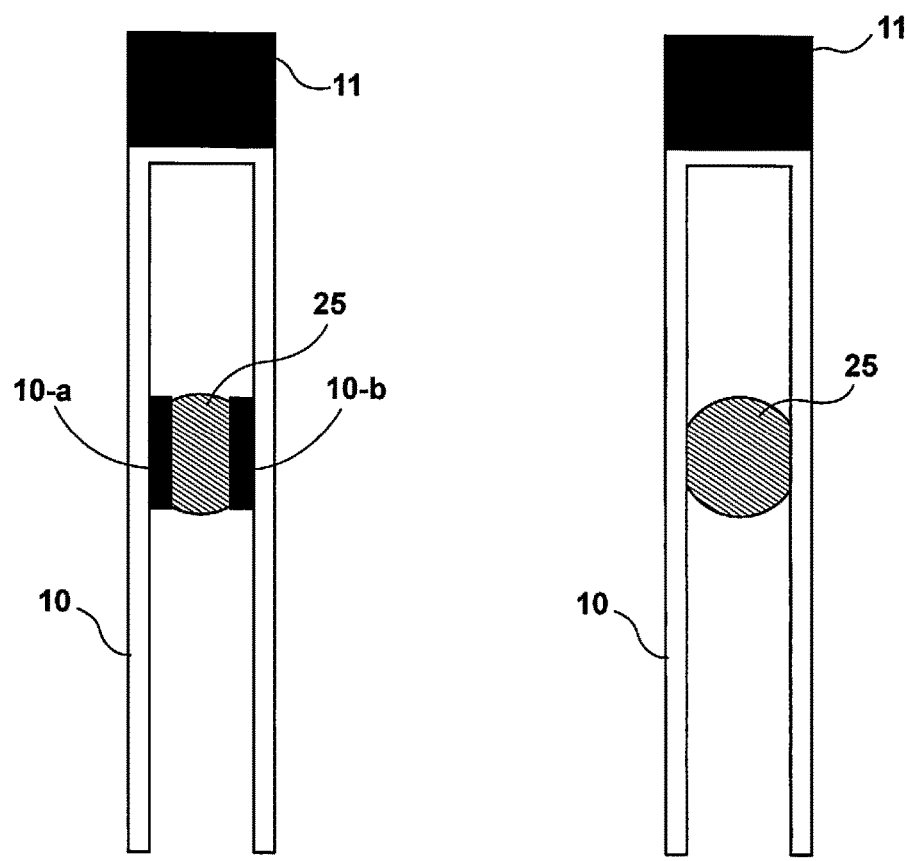
FIG. 6 is a view showing a half-wavelength resonator 10 provided with half-wavelength resonator protrusions (capacity-component adjust parts) 10-*a*, 10-*b* (upper part in figure), and a half-wavelength resonator 10 not provided with the half-wavelength resonator protrusions (capacity-component adjust parts) 10-*a*, 10-*b* (lower part in figure)

A figure shown in the upper part of FIG. 6 is a sectional view of an example of a tunable dual-band resonator configured according to the present invention. The half-wavelength resonator protrusions (capacity-component adjust parts) 10-*a*, 10-*b* are manufactured integrally with the half-wavelength resonator 10 composed of microstrip conductors making up the resonator. Further, a feeder conductor line 13 is provided along the half-wavelength resonator 10 for the purpose of inputting a signal to/outputting a signal from the dual-band resonator.

Figure 7A:
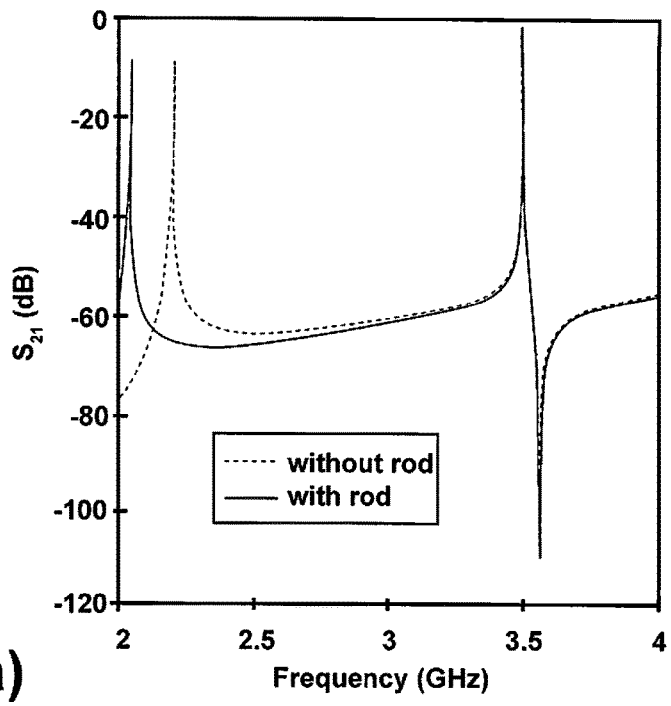
FIG. 7(*a*) is a view showing the frequency characteristics of the half-wavelength resonator 10 provided with the half-wavelength resonator protrusions (capacity-component adjust parts) 10-*a*, 10-*b* (upper part in figure), and FIG. 7(*b*) is a view showing frequency characteristics of the half-wavelength resonator 10 not provided with half-wavelength resonator protrusions (capacity-component adjust parts) 10-*a*, 10-*b* (lower part in figure)
Figure 7B:
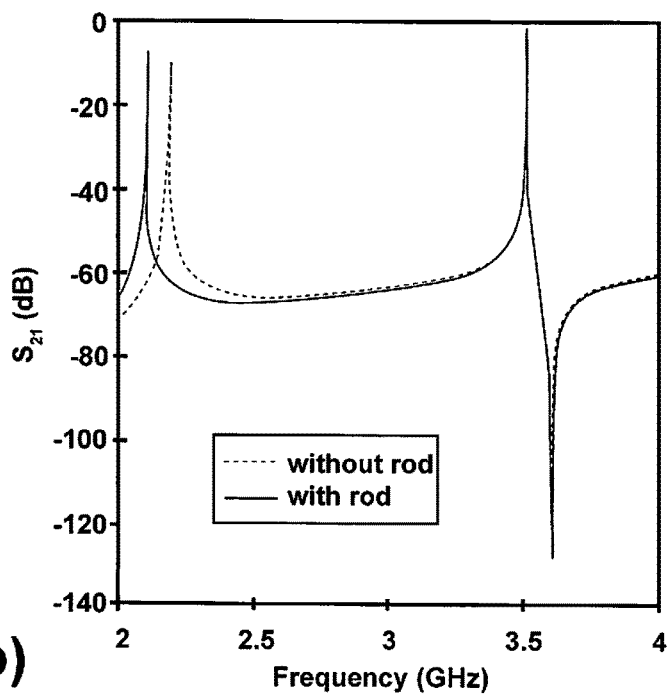

It was possible to considerably increase the shifting width in the odd-number mode by providing the dielectric rod 25 in the space above each of the half-wavelength resonator protrusions (capacity-component adjust parts) 10-*a*, 10-*b* of the half-wavelength resonator 10, and moving the dielectric rod 25 in a direction perpendicular to the planes of the strip conductor (half-wavelength resonator) 10 (see FIG. 7(*a*)). At this point in time, since the resonance frequency of the dual-band resonator in the odd-number mode alone is shifted while that in the even-number mode shows a fixed value, it is possible to completely tune the resonance frequency in the even-number mode and resonance frequency in the odd-number mode, independently from each other.

Comparative Example

A figure shown in the lower part of FIG. 6 is a sectional view of a tunable dual-band resonator configured for the purpose of comparison. This is the half-wavelength resonator 10, composed of microstrip conductors making up the resonator not provided with the half-wavelength resonator protrusions (capacity-component adjust parts) 10-*a*, 10-*b*. Further, a feeder conductor line 13 is provided along the half-wavelength resonator 10 for the purpose of inputting a signal to/outputting a signal from the dual-band resonator. A feeder conductor line 13 is provided along the other half-wavelength resonator 10 in order to take out a signal.

With respect to this resonator, that is a tunable dual-band resonator characterized in that the dielectric rod 25 having a circular cross section is provided in the space above a common half-wavelength resonator 10 not provided with the half-wavelength resonator protrusions (capacity-component adjust parts) 10-*a*, 10-*b*, frequency characteristics of the resonator was examined in both of the cases where the dielectric rod 25 having a circular cross section is provided in the space above the half-wavelength resonator 10, so as to oppose the plane of the strip conductor 23, and the case where the dielectric rod 25 having a circular cross section is not provided.

In order to check the examination results, a simulation was conducted by use of a three-dimensional electromagnetic-field analytical simulator (manufactured by AET Corp.). The resonance frequency of the dual-band resonator was 2.25 GHz in the odd-number mode, and 3.5 GHz in the even-number mode. The dielectric constant of the dielectric rod 25 was 39, and the diameter of the dielectric rod 25 was the same as the width of the dual-band resonator. In this case, the diameter of the dielectric rod 25 was 2.5 mm. Further, the dielectric rod 25 was 20 mm in length. A distance between the dual-band resonator and the dielectric rod 25 was 0.01 mm when the dielectric rod 25 was disposed.

It is evident from the FIG. 7(*a*) that a shift width in the odd-number mode of the half-wavelength resonator 10 provided with the half-wavelength resonator protrusions (capacity-component adjust parts) 10-*a*, 10-*b* is increased about 1.8 times as much as that in the case of the common half-wavelength resonator 10 (FIG. 7(*b*)) not provided with the half-wavelength resonator protrusions (capacity-component adjust parts) 10-*a*, 10-*b*. Since the frequency in the even-number mode is not shifted in this case, it is evident that the resonance frequency only in the odd-number mode can be independently adjusted.

Example 2

Figure 8:
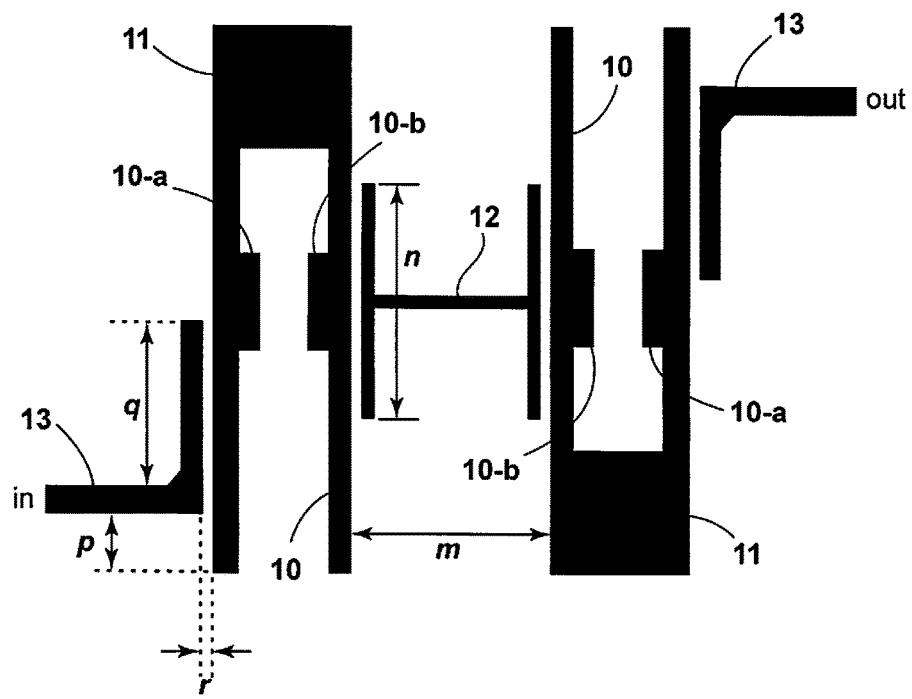
FIG. 8 is a view showing a two-stage tunable dual-band band-pass filter adopting the half-wavelength resonator 10 provided with the half-wavelength resonator protrusions (capacity-component adjust parts) 10-*a*, 10-*b*.

FIG. 8 shows a tunable dual-band band-pass filter made up by combining the tunable dual-band resistor of the present invention in two stages. Depicted by 12 is a waveguide, and in order to input a signal to/output a signal from the tunable dual-band band-pass filter, a feeder conductor line 13 is disposed along a half-wavelength resonator 10 on the left-hand side. In order to take out a signal, a feeder conductor line 13 is disposed along a half-wavelength resonator 10 on the right-hand side. Although a dielectric rod 25 is provided in the space above each of the half-wavelength resonator protrusions (capacity-component adjust parts) 10-*a*, 10-*b*, and a dielectric rod 25 is provided in the space above each of the respective stubs 11, they are not shown in FIG. 8.

Example 3

Figure 9:
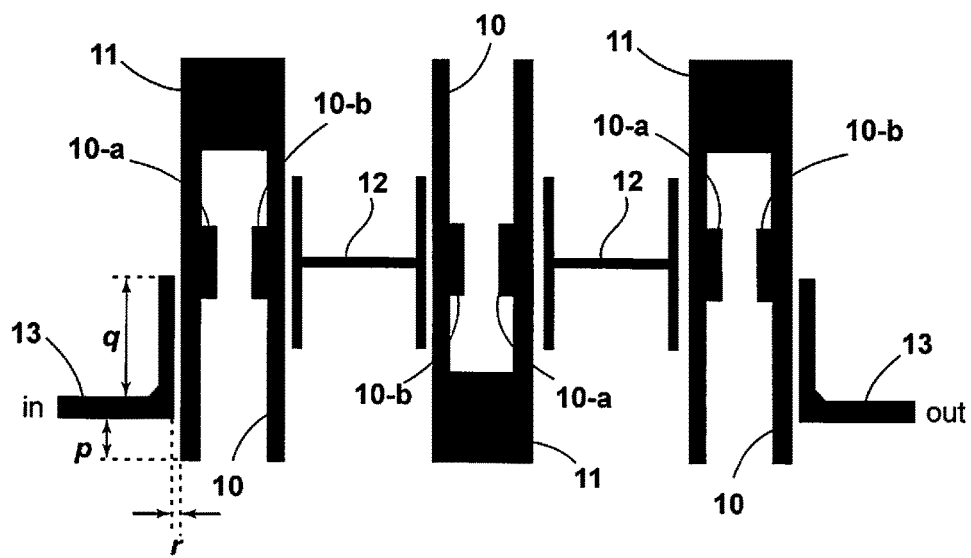
FIG. 9 is a view showing a three-stage tunable dual-band band-pass filter adopting the half-wavelength resonator 10 provided with the half-wavelength resonator protrusions (capacity-component adjust parts) 10-*a*, 10-*b*.

FIG. 9 shows a tunable dual-band band-pass filter made up by combining the tunable dual-band resistor of the present invention in three stages. Depicted by 12 is a waveguide, and in order to input a signal to/output a signal from the tunable dual-band band-pass filter, a feeder conductor line 13 is disposed along a half-wavelength resonator 10 on the left-hand side. In order to take out a signal, a feeder conductor line 13 is disposed along a half-wavelength resonator 10 on the right-hand side. A dielectric rod 25 provided in the space above each of the half-wavelength resonator protrusions (capacity-component adjust parts) 10-*a*, 10-*b*, and a dielectric rod 25 provided in the space above each of the respective stubs 11 are not shown in FIG. 9.

Example 4

FIG. 10 is a plan view showing one example or embodiment of a six-stage dual-band band-pass filter according to the present invention, using a microstrip-line structure. Depicted by 12 is a waveguide, and in order to input a signal to/output a signal from a tunable dual-band band-pass filter, a feeder conductor line 13 is disposed along a half-wavelength resonator 10 on the left-hand side. In order to take out a signal, a feeder conductor line 13 is disposed along a half-wavelength resonator 10 on the right-hand side. A dielectric rod 25 provided in the space above each of the half-wavelength resonator protrusions (capacity-component adjust parts) 10-*a*, 10-*b* of the half-wavelength resonator 10 and a dielectric rod 25 provided in the space above each of the respective stubs 11 are not depicted in FIG. 10.

Further, in a figure in the lower part of FIG. 10, there are shown the characteristics of the six-stage dual-band band-pass filter, in the case where the dielectric rod 25 is inserted in the half-wavelength resonator 10, and in the case where the dielectric rod 25 is not inserted in the half-wavelength resonator 10, respectively. It has been confirmed that with the dual-band band-pass filter using the half-wavelength resonator 10 provided with the half-wavelength resonator protrusions (capacity-component adjust parts) 10-*a*, 10-*b*, according to the present invention, the center-frequency in the odd-number mode is found considerably shifted.

Example 5

FIG. 11(*b*) is a plan view showing one example of a dual band resonator constituted according to the present invention. Since a half-wavelength resonator 10 is structured in a stepped impedance structure, the shift amount of resonance frequency in the odd-number mode is increased. According to the stepped impedance structure of the half-wavelength resonator 10 as shown in FIG. 11(*b*), the line width is thinned at the portion close to the open end and thickened up to a portion close to a connection portion between each stub 11 and each half-wavelength resonator 10, thereby causing the half-wavelength resonator protrusions (capacity-component adjust parts) 10-*a*, 10-*b* to be structured in the stepped impedance structures 10-*a*', 10-*b*' by extending the half-wavelength resonator protrusions close to the connection portion between the stub 11 and the half-wavelength resonator 10. With such a configuration, the entire length of the half-wavelength resonator 10 as shown in FIG. 11(*b*) becomes longer compared with the half-wavelength resonator 10 of the common dual band resonator having no stepped impedance structures 10-*a*', 10-*b*' shown in FIG. 11(*a*).

With respect to this resonator, that is a tunable dual-band resonator characterized in that the dielectric rod 25 having a circular cross section is provided in the space above a common half-wavelength resonator 10, the frequency characteristics of the resonator was examined in both the cases where the dielectric rod 25 having a circular cross section is provided in the space above the half-wavelength resonator 10, so as to oppose the plane of the strip conductor 23, and the case where the dielectric rod 25 having a circular cross section is not provided.

In order to check the examination results, a simulation was conducted by use of a three-dimensional electromagnetic-field analytical simulator (manufactured by AET Corp.). The resonance frequency of the dual-band resonator was 1.5 GHz in the odd-number mode and 2.0 GHz in the even-number mode. The dielectric constant of the dielectric rod 25 was 39 and the diameter of the dielectric rod 25 was the same as the width of the dual-band resonator. In this case, the diameter of the dielectric rod 25 was 2.0 mm. Further, the dielectric rod 25 was 20 mm in length. The distance between the dual-band resonator and the dielectric rod 25 was 0.01 mm when the dielectric rod 25 was disposed.

Figure 12A:
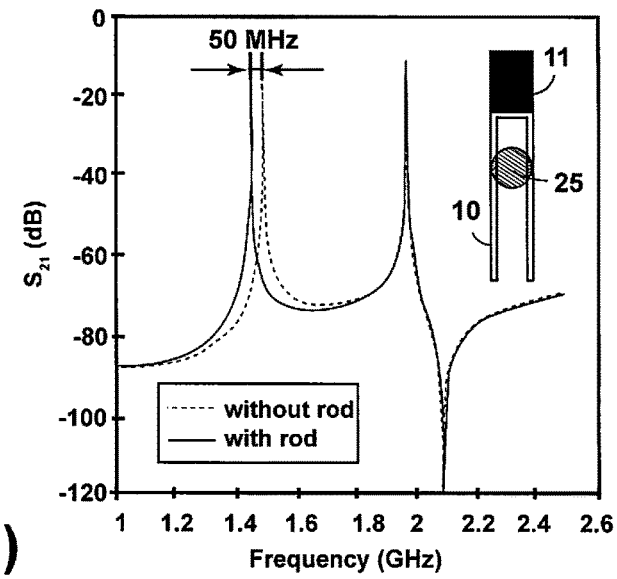
FIG. 12(*a*) is a view showing frequency characteristics of the common dual-band resonator in both of the cases where a dielectric rod is provided and the case where the dielectric rod is not provided, FIG. 12(*b*) is a view showing frequency characteristics of the dual-band resonator, wherein a half-wavelength resonator is structured in a stepped impedance structure, in both of the cases where a dielectric rod is provided and the case where the dielectric rod is not provided.
Figure 12B:
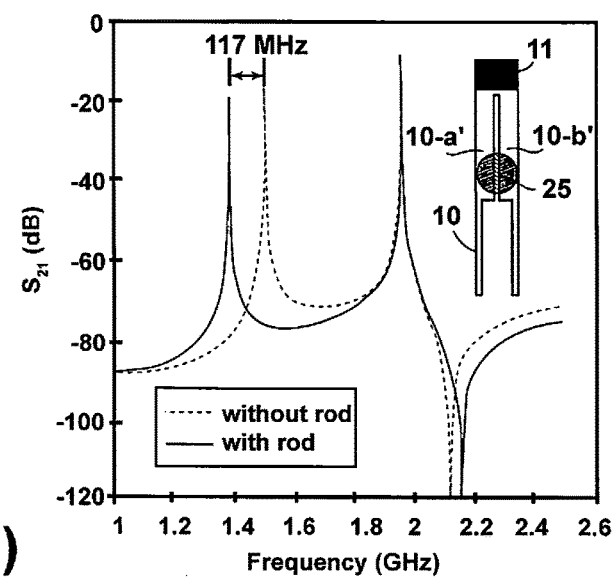
Figure 13:
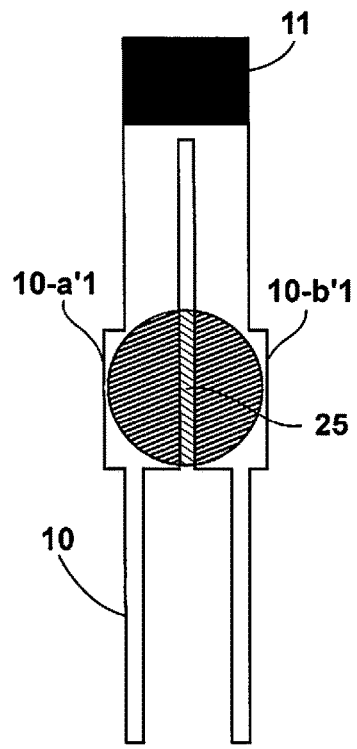
FIG. 13 is a plan view of a dual band resonator, wherein a half-wavelength resonator is structured in a stepped impedance structure and provided with half-wavelength resonator protrusions (capacity-component adjust parts) 10-*a'l*, 10-*b'l*.

It is evident from the FIG. 12(*b*) that a shift width in the odd-number mode of the half-wavelength resonator 10 provided with the stepped impedance structures 10-*a*', 10-*b*' is increased about 2.3 times as much as that in the case of the common half-wavelength resonator 10 (FIG. 12(*a*)) not provided with the stepped impedance structures 10-*a*', 10-*b*'. Since the frequency in the even-number mode is not shifted in this case, it is evident that the resonance frequency only in the odd-number mode can be independently adjusted.

With respect to the configuration of the resonator shown in FIG. 11(*b*), in order to increase the shift amount of the resonance frequency in the odd-mode tuning, protrusions (capacity-component adjust parts) 10-*a*′l, 10-*b*′l are added. With such an addition of the protrusions, it is possible to use a dielectric rod having a larger diameter than the dielectric rod used in FIG. 11(*b*), the variation amount of the capacity component of the resonator is increased, so that the shift amount of the resonance frequency in the odd-mode is increased.

Figure 14:
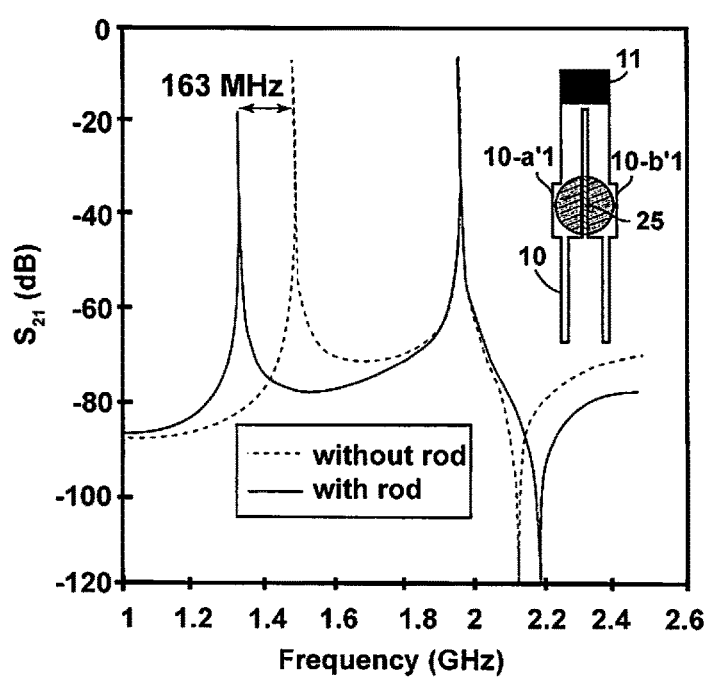
FIG. 14 is a view showing the frequency characteristics of the dual-band resonator, wherein a half-wavelength resonator is structured in a stepped impedance structure and provided with half-wavelength resonator protrusions (capacity-component adjust parts) 10-*a'l*, 10-*b'l*, in both of the cases where a dielectric rod is provided and the case where the dielectric rod is not provided.

In FIG. 14, there is shown the frequency characteristics of the resonator in both the cases where the dielectric rod 25 having a circular cross section is provided and the case dielectric rod 25 having a circular cross section is not provided. The diameter of the dielectric rod 25 used in this case was 2.5 mm and is made larger than the dielectric rod 25 by 0.5 mm. From FIG. 14, since the shift amount of the resonance frequency was about 163 MHz, the shift amount of the resonance frequency was increased about 3.26 times as much as that in the case of using the common half-wavelength resonator 10 shown in FIG. 11(*a*). Since the frequency in the even-number mode is not shifted in this case, it is evident that the resonance frequency only in the odd-number mode can be independently adjusted.

Example 6

Figure 15:
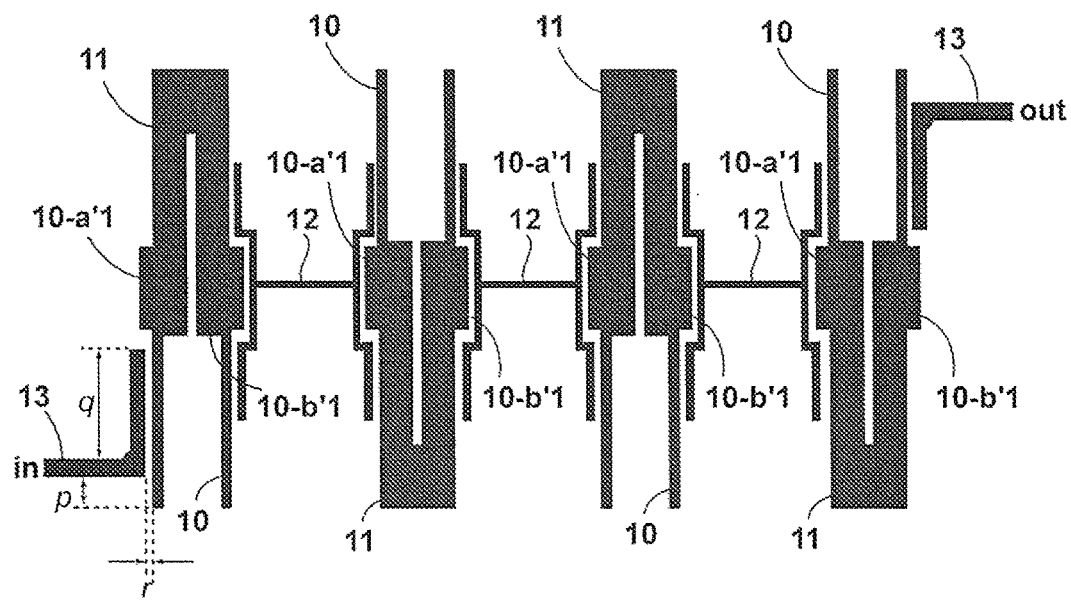
FIG. 15 is a view showing a four-stage tunable dual-band band-pass filter having a structure incorporating the dual-band resonator, that is provided with the stepped impedance structure and the half-wavelength resonator protrusions (capacity-component adjust parts) 10-*a'l*, 10-*b'l*.

FIG. 15 is a plan view showing an example of a four-stage tunable dual-band band-pass filter having a structure incorporating the dual-band resonator configured by the present invention, each dual-band resonator is provided with the stepped impedance structure and the half-wavelength resonator protrusions (capacity-component adjust parts) 10-*a*′l, 10-*b*′l, and employs a microstrip-line structure. Depicted by 12 is a waveguide, and in order to input a signal to/output a signal from a tunable dual-band band-pass filter, a feeder conductor line 13 is disposed along a half-wavelength resonator 10 on the left-hand side. In order to take out a signal, a feeder conductor line 13 is disposed along a half-wavelength resonator 10 on the right-hand side. There is not shown the dielectric rod 25 provided in the space above the half-wavelength resonator protrusions (capacity-component adjust parts) 10-*a*′l, 10-*b*′l and another dielectric rod 25 provided in the space above the respective stubs 11.

Figure 16:
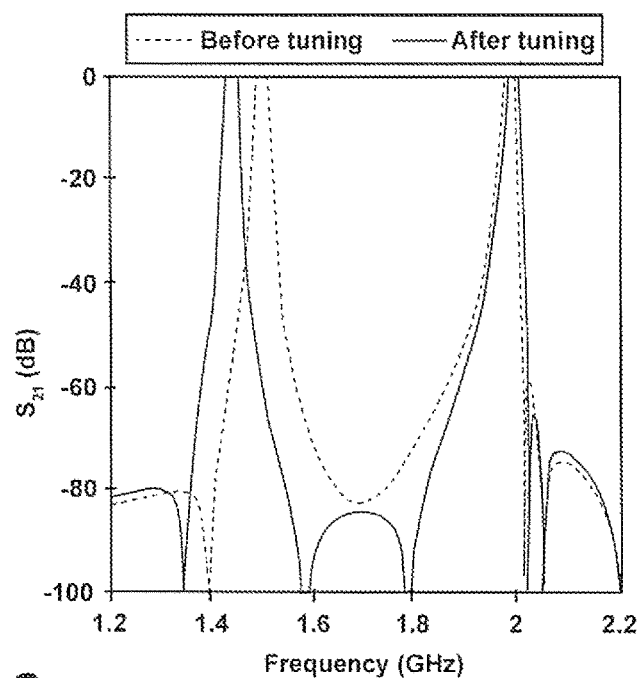
FIG. 16 is a view showing the frequency characteristics of the dual-band resonator, with respect to the four-stage tunable dual-band band-pass filter, provided with the stepped impedance structure and the half-wavelength resonator protrusions (capacity-component adjust parts) 10-*a'l*, 10-*b'l* in both of the cases where the dielectric rod 25 is provided in the space above the half-wavelength resonator 10, and the case where the dielectric rod 25 is not provided.

Further, with respect to the four-stage tunable dual-band band-pass filter, FIG. 16 shows the frequency characteristics of the resonator in both the cases where the dielectric rod 25 was inserted in the space above the half-wavelength resonator 10, and the case where the dielectric rod 25 was not inserted.

It has been confirmed that with the dual-band band-pass filter using the half-wavelength resonator 10 provided with the stepped impedance structures and the half-wavelength resonator protrusions (capacity-component adjust parts) 10-*a*′l, 10-*b*′l, according to the present invention, the center-frequency in the odd-number mode is found considerably shifted.

Industrial Utilization

Since the tunable dual-band resonator and the tunable dual-band band-pass filter using the tunable dual-band resonator can adjust the center-frequencies of each band independently from each other, and can considerably shift the center frequencies in each odd-number mode, and also can improve the band-pass characteristics, undergoing degeneration after the tuning of the respective center-frequencies, the present invention can be diverted to all sorts of filters used for communication, to thereby contribute to the development of the communications fields and result in extremely-high industrial utilization.

The invention claimed is:

1. A tunable dual-band resonator structured such that a stub is added to a half-wavelength resonator provided with half-wavelength resonator protrusions; wherein symmetric planes of the stub function as an electrical and a magnetic wall, respectively; the tunable dual-band resonator operating in two frequency-bands due to a resonance in an odd-number mode and a resonance in an even-number mode, and being capable of adjusting a resonator length such that the half-wavelength resonator operates in the odd-number mode, while the half-wavelength resonator and the stub operate in the even-number mode, thereby causing the odd-number mode to resonate on a low-frequency side, while causing the even-number mode to resonate on a high-frequency side, or alternatively, enabling the odd-number mode to resonate on the high-frequency side, while enabling the even-number mode to resonate on the low-frequency side;

said when operating in the odd-number mode, tunable dual-band resonator is made up of an odd-number mode resonator in a shape including a ground conductor in a predetermined thickness disposed on the back surface of a dielectric body, and a strip conductor disposed on the top surface thereof, the strip conductor having an open-end thereof being provided with a deeply retreated groove having a width g, the strip conductor having a width d at a tip of the groove and at an end face of the strip conductor; and when operating in the even-number mode, said tunable dual-band resonator is made up of an even-number mode resonator being in such a shape as to be formed when the stub having a length 1 is connected to the end face of the strip conductor which is on an opposite side of the open-end of the strip conductor;

wherein the tunable dual-band resonator operates as the odd-number mode resonator when an electric current flows to the symmetric planes of the stub, and operates as the even-number mode resonator when the electric current does not flow to the symmetric planes;

characterized in that a dielectric rod having a circular cross section is provided in a space above the stub, and the dielectric rod is provided in a space above the half-wavelength resonator protrusions of the half-wavelength resonator, thereby enabling a resonance frequency in the even-number mode, and a resonance frequency in the odd-number mode, to be tuned independently from each other.

* * * * *